United States Patent
Okita et al.

(10) Patent No.: US 11,913,135 B2
(45) Date of Patent: Feb. 27, 2024

(54) SILICON CARBIDE SUBSTRATE AND METHOD OF MANUFACTURING SILICON CARBIDE SUBSTRATE

(71) Applicant: SUMITOMO ELECTRIC INDUSTRIES, LTD., Osaka (JP)

(72) Inventors: Kyoko Okita, Osaka (JP); Tsubasa Honke, Osaka (JP); Shunsaku Ueta, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 95 days.

(21) Appl. No.: 17/780,702

(22) PCT Filed: Nov. 10, 2020

(86) PCT No.: PCT/JP2020/041822
§ 371 (c)(1),
(2) Date: May 27, 2022

(87) PCT Pub. No.: WO2021/111817
PCT Pub. Date: Jun. 10, 2021

(65) Prior Publication Data
US 2023/0357957 A1 Nov. 9, 2023

(30) Foreign Application Priority Data
Dec. 2, 2019 (JP) ................... 2019-218126

(51) Int. Cl.
*C30B 29/36* (2006.01)
*H01L 29/16* (2006.01)
(Continued)

(52) U.S. Cl.
CPC ............ *C30B 29/36* (2013.01); *C01B 32/956* (2017.08); *C30B 33/10* (2013.01);
(Continued)

(58) Field of Classification Search
CPC ................................ C30B 29/36; C30B 33/10
See application file for complete search history.

(56) References Cited

U.S. PATENT DOCUMENTS

2011/0136717 A1 6/2011 Tamboli et al.
2015/0361585 A1 12/2015 Aigo et al.
(Continued)

FOREIGN PATENT DOCUMENTS

| JP | 2003-510840 A | 3/2003 |
|---|---|---|
| JP | 2015-073098 A | 4/2015 |

(Continued)

OTHER PUBLICATIONS

Brix [online], 1974, [retrieved on Jan. 6, 2021], Internet: <URL:https://www.atago.net/japanese/new/databook-refractometer_relationship.php>, tables, particularly, Brix (ICUMSA 1974 (Atago Co., Ltd.), non-official translation (Brix (sucrose g/I00g) vs index of refraction, Brix 0-85% values by International Commission for Uniform Methods of Sugar Analysis (ICUMSA 1974)).

*Primary Examiner* — Elizabeth E Mulvaney
(74) *Attorney, Agent, or Firm* — Renner, Otto, Boisselle & Sklar, LLP

(57) ABSTRACT

A silicon carbide substrate has a first main surface and a second main surface opposite to the first main surface. The silicon carbide substrate includes screw dislocations and pits having a maximum diameter of 1 μm or more and 10 μm or less in a direction parallel to the first main surface. When the screw dislocations and the pits are observed in the first main surface, a percentage obtained by dividing a number of the pits by a number of the screw dislocations is 1% or less. A concentration of magnesium in the first main surface is less than $1 \times 10^{11}$ atoms/cm$^2$.

17 Claims, 8 Drawing Sheets

(51) Int. Cl.
*H01L 29/34* (2006.01)
*C30B 33/10* (2006.01)
*C01B 32/956* (2017.01)
*H01L 21/306* (2006.01)

(52) U.S. Cl.
CPC .... *H01L 21/30625* (2013.01); *H01L 29/1608* (2013.01); *H01L 29/34* (2013.01); *C01P 2006/80* (2013.01)

(56) References Cited

U.S. PATENT DOCUMENTS

| | | |
|---|---|---|
| 2017/0306526 A1 | 10/2017 | Okita |
| 2018/0033703 A1 | 2/2018 | Honke et al. |
| 2018/0282902 A1 | 10/2018 | Nakabayashi |
| 2018/0355513 A1 | 12/2018 | Okita |
| 2018/0363166 A1 | 12/2018 | Wada et al. |
| 2020/0388683 A1 | 12/2020 | Okita et al. |

FOREIGN PATENT DOCUMENTS

| | | |
|---|---|---|
| JP | 2015-129086 A | 7/2015 |
| JP | 2016-174162 A | 9/2016 |
| JP | 2016-210680 A | 12/2016 |
| JP | 2017-145150 A | 8/2017 |
| WO | 2001/024242 A1 | 4/2001 |
| WO | 2014/196394 A1 | 12/2014 |
| WO | 2017/057742 A1 | 4/2017 |
| WO | 2019/111507 A1 | 6/2019 |

SILICON CARBIDE SUBSTRATE AND METHOD OF MANUFACTURING SILICON CARBIDE SUBSTRATE

TECHNICAL FIELD

The present disclosure relates to a silicon carbide substrate and a method of manufacturing silicon carbide substrate.

This application claims priority based on Japanese Patent Application No. 2019-218126 filed on Dec. 2, 2019, the entire contents of which are incorporated herein by reference.

BACKGROUND ART

WO 2019/111507 (Patent Document 1) describes a process of performing chemical mechanical polishing on a silicon carbide single-crystal substrate.

CITATION LIST

Patent Literature

Patent Document 1: WO 2019/111507 A1

SUMMARY OF INVENTION

A silicon carbide substrate according to an embodiment of the present disclosure includes a first main surface and a second main surface opposite to the first main surface. The silicon carbide substrate includes screw dislocations and pits having a maximum diameter of 1 µm to 10 µm in a direction parallel to the first main surface. When the screw dislocations and the pits are observed in the first main surface, a percentage obtained by dividing a number of the pits by a number of the screw dislocations is 1% or less. A concentration of magnesium in the first main surface is less than $1 \times 10^{11}$ atoms/cm$^2$.

A method of manufacturing a silicon carbide substrate according to the present disclosure includes: preparing a silicon carbide single-crystal substrate having a first main surface and a second main surface opposite to the first main surface; performing chemical mechanical polishing on the silicon carbide single-crystal substrate using a polishing liquid; and after the performing the chemical mechanical polishing on the silicon carbide single-crystal substrate using the polishing liquid, treating the silicon carbide single-crystal substrate using a solution containing an organic acid having two or more carboxy groups in one molecule. The polishing liquid has a Brix value of 10 or more.

DETAILED DESCRIPTION

Figure 1:
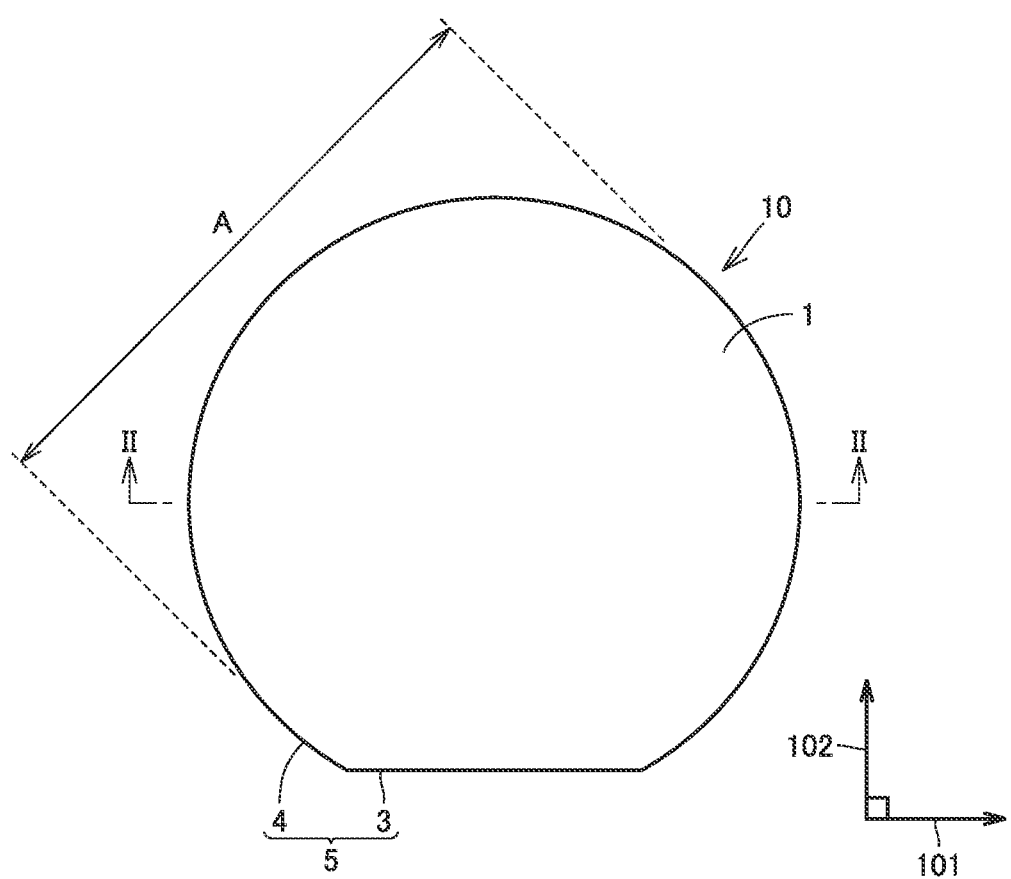
FIG. 1 is a schematic plan view showing the configuration of a silicon carbide substrate according to the present embodiment.

Problems to be Solved by the Present Disclosure

An object of the present disclosure is to provide a silicon carbide substrate capable of improving cleanliness and a method of manufacturing the silicon carbide substrate capable of improving cleanliness.

Advantageous Effect of the Present Disclosure

According to the present disclosure, it is possible to provide a silicon carbide substrate capable of improving cleanliness and a method of manufacturing the silicon carbide substrate capable of improving cleanliness.

Description of Embodiments (1) A silicon carbide substrate 10 according to an embodiment of the present disclosure includes a first main surface 1 and a second main surface 2 opposite to first main surface 1. Silicon carbide substrate 10 includes screw dislocations 13 and pits 11 having a maximum diameter of 1 µm to 10 µm in a direction parallel to the first main surface. When screw dislocations 13 and pits 11 are observed in first main surface 1, a percentage obtained by dividing a number of pits 11 by a number of screw dislocations 13 is 1% or less. A concentration of magnesium in first main surface 1 is less than $1 \times 10^{11}$ atoms/cm$^2$.

(2) In silicon carbide substrate 10 according to (1), each of concentrations of calcium, aluminum, sodium, potassium, and manganese in first main surface 1 is less than $1 \times 10^{11}$ atoms/cm$^2$.

(3) In silicon carbide substrate 10 according to (1), each of concentrations of magnesium, calcium, aluminum, sodium, potassium, and manganese in first main surface 1 is less than $5 \times 10^{10}$ atoms/cm$^2$.

(4) In silicon carbide substrate 10 according to any one of (1) to (3), screw dislocations 13 in first main surface 1 may have an area density of 100 cm$^{-2}$ to 5000 cm$^{-2}$.

(5) In silicon carbide substrate 10 according to any one of (1) to (4), first main surface 1 may have a maximum diameter of 150 mm or more.

(6) A method of manufacturing a silicon carbide substrate 10 according to an embodiment of the present disclosure includes: preparing a silicon carbide single-crystal substrate 100 having a first main surface 1 and a second main surface 2 opposite to first main surface 1; performing chemical mechanical polishing on silicon carbide single-crystal substrate 100 using a polishing liquid 40; and after the performing the chemical mechanical polishing on silicon carbide single-crystal substrate 100 using polishing liquid 40, treating silicon carbide single-crystal substrate 100 using a solution 52 containing an organic acid having two or more carboxy groups in one molecule. Polishing liquid 40 has a Brix value of 10 or more.

(7) In the method of manufacturing silicon carbide substrate 10 according to (6) may further include after the performing the chemical mechanical polishing on silicon carbide single-crystal substrate 100 using polishing liquid 40 and before treating silicon carbide single-crystal substrate 100 using solution 52 containing the organic acid having the two or more carboxy groups in the one molecule, immersing silicon carbide single-crystal substrate 100 in an alkaline solution 51.

(8) In the method of manufacturing silicon carbide substrate 10 according to (6) or (7), the organic acid may have the two or more carboxy groups in the one molecule is oxalic acid or citric acid.

(9) In the method of manufacturing silicon carbide substrate 10 according to any one of (6) to (8), the Brix value may be 30 or less.

Details of Embodiment of the Present Disclosure

Hereinafter, embodiments of the present disclosure will be described with reference to the drawings. In the following drawings, the same or corresponding portions are denoted by the same reference numerals, and the description thereof will not be repeated. Regarding crystallographic indications in the present specification, an individual orientation is represented by [ ], a group orientation is represented by < >, an individual plane is represented by ( ) and a group plane is represented by { }. Generally, a negative index is supposed to be crystallographically indicated by putting "-" (bar) above a numeral but is indicated by putting the negative sign before the numeral in the present specification.

Figure 2:
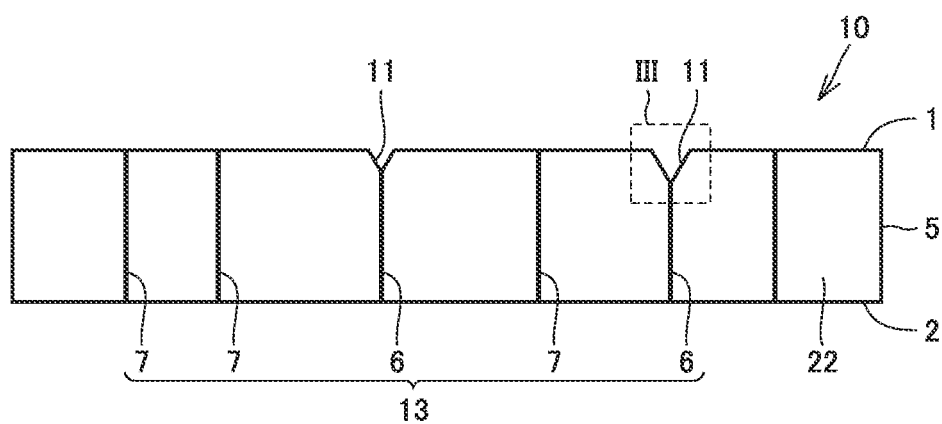
FIG. 2 is a schematic cross-sectional view taken along line II-II of FIG. 1.

First, the configuration of the silicon carbide substrate according to the present embodiment will be described. FIG. 1 is a schematic plan view showing the configuration of a silicon carbide substrate according to the present embodiment. FIG. 2 is a schematic cross-sectional view taken along line II-II of FIG. 1.

As shown in FIGS. 1 and 2, silicon carbide substrate 10 according to this embodiment mainly has first main surface 1, second main surface 2, and an outer circumferential surface 5. As shown in FIG. 2, second main surface 2 is located opposite to first main surface 1. Silicon carbide substrate 10 is made of silicon carbide of polytype 4H. Silicon carbide substrate 10 contains an n-type impurity such as nitrogen (N). The conductivity type of silicon carbide substrate 10 is, for example, n-type. The concentration of n-type impurities in silicon carbide substrate 10 is, for example, $1 \times 10^{17}$ $cm^{-3}$ or more and $1 \times 10^{20}$ $cm^{-3}$ or less.

As shown in FIG. 1, a maximum diameter A of first main surface 1 is, for example, 150 mm or more (6 inches or more). Maximum diameter A of first main surface 1 may be, for example, 200 mm or more (8 inches or more). Maximum diameter A of first main surface 1 is the longest linear distance between two different points on outer circumferential surface 5 of silicon carbide substrate 10 when viewed in a direction perpendicular to first main surface 1. In this specification, 6 inches means 150 mm or 152.4 mm (25.4 mm/inch×6 inches). 8 inches means 200 mm or 203.2 mm (25.4 mm/inch×8 inches).

First main surface 1 is, for example, a {0001} plane or a plane inclined at an off angle more than 0° and 8° or less relative to the {0001} plane. The off angle may be, for example, 1° or more, or 2° or more. The off angle may be 7° or less, or may be 6° or less. Specifically, first main surface 1 may be a (0001) plane or a plane inclined at an off angle more than 0° and 8° or less relative to the (0001) plane. First main surface 1 may be a (000-1) plane or a plane inclined at an off angle of more than 0° and 8° or less relative to the (000-1) plane. The inclination direction of first main surface 1 is, for example, the <11-20> direction.

As shown in FIG. 1, outer circumferential surface 5 may have, for example, a first flat 3 and an arc-shaped portion 4. First flat 3 extends along a first direction 101, for example. Arc-shaped portion 4 is continuous with first flat 3. Outer circumferential surface 5 may have a second flat (not shown) extending along a second direction 102, for example. Second direction 102 is, for example, a <1-100> direction. First direction 101 is a direction parallel to first main surface 1 and perpendicular to second direction 102. First direction 101 is, for example, a <11-20> direction.

First main surface 1 is, for example, an epitaxial layer formation surface. From another viewpoint, a silicon carbide epitaxial layer (not shown) is provided on first main surface 1. Second main surface 2 is, for example, a drain electrode forming surface. From another viewpoint, a drain electrode (not shown) of a MOSFET (Metal Oxide Semiconductor Field Effect Transistor) is formed on second main surface 2.

As shown in FIG. 2, silicon carbide substrate 10 includes a plurality of screw dislocations 13, pits 11, and silicon carbide regions 22. The plurality of screw dislocations 13 includes a first screw dislocation 6 continuous with pit 11 and a second screw dislocation 7 not continuous with pit 11. From another viewpoint, pit 11 is caused by first screw dislocation 6. Pit 11 is opening in first main surface 1 and not in second main surface 2. First screw dislocation 6 is continuous with second main surface 2. Second screw dislocation 7 is continuous with each of first main surface 1 and second main surface 2. From another viewpoint, second screw dislocation 7 passes through a silicon carbide region 22 from first main surface 1 to second main surface 2.

Figure 3:
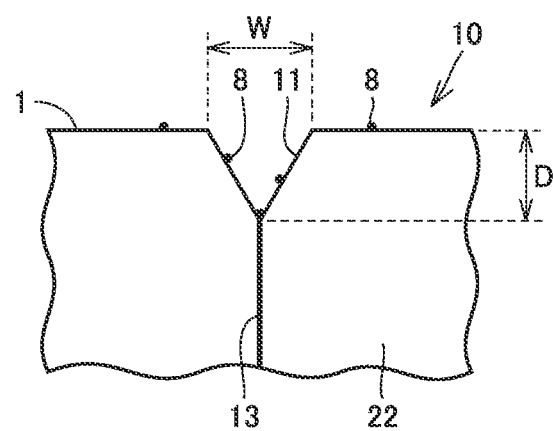
FIG. 3 is an enlarged schematic view of region III of FIG. 2.

FIG. 3 is an enlarged schematic view of region III of FIG. 2. As shown in FIG. 3, the width (diameter) of pit 11 decreases from first main surface 1 toward second main surface 2. Pit 11 may be, for example, substantially conical. When viewed in a direction perpendicular to first main surface 1, pit 11 is substantially circular. A maximum diameter (a first diameter W) of pit 11 in a direction parallel to first main surface 1 is 1 μm or more and 10 μm or less. First diameter W may be 2 μm or more, or may be 3 μm or more. The maximum diameter of pit 11 is the longest linear distance between two different points on the outer peripheral edge of pit 11 exposed to first main surface 1. The maximum depth (a first depth D) of pit 11 in the direction perpendicular to first main surface 1 may be, for example, from 3 nm to 1 μm.

As shown in FIG. 2, the number of screw dislocations 13 is more than the number of pits 11. Specifically, when screw dislocations 13 and pits 11 are observed in first main surface 1, the percentage obtained by dividing the number of pits 11 by the number of screw dislocations 13 is 1% or less. A percentage obtained by dividing the number of pits 11 by the number of screw dislocations 13 may be, for example, 0.5% or less, 0.4% or less, or 0.3% or less. The lower limit of the percentage obtained by dividing the number of pits 11 by the number of screw dislocations 13 is not particularly limited. The lower limit may be, for example, 0.01% or more or 0.1% or more.

The area density of screw dislocation 13 in first main surface 1 is, for example, from 100 $cm^{-2}$ to 5000 $cm^{-2}$. The lower limit of the area density of screw dislocation 13 in first main surface 1 is not particularly limited, but may be, for example, 200 $cm^{-2}$ or more or 500 $cm^{-2}$ or more. The upper limit of the area density of screw dislocations 13 in first main surface 1 is not particularly limited. The upper limit may be, for example, 4500 cm$^{-2}$ or less or 4000 cm$^{-2}$ or less.

Method of Measuring Screw Dislocation

The number of screw dislocations 13 can be measured using an X-ray topography method, for example. The measuring device is, for example, a XRTmicron made of Rigaku Corporation. Specifically, the number of screw dislocations 13 can be measured based on an X-ray topographic image of first main surface 1 of silicon carbide substrate 10. The x-ray topographic image is due to (0008) reflection. A Cu target is used as an X-ray source during measurement. The pixel size of the X-ray camera is 5.4 μm.

Method of Measuring Pit

The number of pits 11 can be measured using, for example, a defect inspection apparatus including a confocal differential interference microscope. The defect inspection apparatus is, for example, WASAVI series "SICA 6X" made of Lasertec Corporation. The magnification of the objective lens is, for example, 10 times. Specifically, first main surface 1 of silicon carbide substrate 10 is irradiated with light of wavelengths 546 nm from a light source such as a mercury-xenon lamp and reflected light of the light is observed by a light receiving element such as a CCD (Charge-Coupled Device).

The difference between the brightness of a certain pixel in the observed image and the brightness of pixels surrounding the certain pixel is digitized. The threshold value of the detection sensitivity of the defect inspection apparatus is determined using a standard sample. By using the defect inspection apparatus, the diameter of pit 11 formed in the sample to be measured can be quantitatively evaluated. Pit 11 having a maximum diameter (first diameter W) of from 1 μm to 10 μm is detected by observing first main surface 1 of silicon carbide substrate 10.

As shown in FIG. 3, a metal impurity 8 exists in first main surface 1. Metal impurity 8 contains, for example, magnesium (Mg). Magnesium exists in first main surface 1. Metal impurity 8 is within pit 11, for example. Metal impurity 8 may be on screw dislocation 13. The magnesium may be in contact with screw dislocation 13. Metal impurity 8 may be in first main surface 1 outside pit 11.

In first main surface 1, the concentration of magnesium is less than $1\times10^{11}$ atoms/cm$^2$. In first main surface 1, the concentration of magnesium may be, for example, less than $5\times10^{10}$ atoms/cm$^2$ or less than $1\times10^{10}$ atoms/cm$^2$. In first main surface 1, the lower limit of the concentration of magnesium is not particularly limited. The lower limit may be, for example, $1\times10^6$ atoms/cm$^2$ or more.

Metal impurity 8 may include, for example, calcium (Ca), aluminum (Al), sodium (Na), potassium (K), and manganese (Mn). Each of calcium, aluminum, sodium, potassium, and manganese may exist in first main surface 1. Each of calcium, aluminum, sodium, potassium, and manganese may be within pit 11, for example. Each of the calcium, aluminum, sodium, potassium and manganese may be on screw dislocation 13. Each of calcium, aluminum, sodium, potassium and manganese may be in contact with screw dislocation 13. Each of calcium, aluminum, sodium, potassium and manganese may be in first main surface 1 outside pit 11.

In first main surface 1, the concentration of calcium may be less than $1\times10^{11}$ atoms/cm$^2$. In first main surface 1, the concentration of calcium may be, for example, less than $5\times10^{10}$ atoms/cm$^2$ or less than $1\times10^{10}$ atoms/cm$^2$. In first main surface 1, the lower limit of the concentration of calcium is not particularly limited. The lower limit may be, for example, $1\times10^6$ atoms/cm$^2$ or more.

In first main surface 1, the concentration of aluminum may be less than $1\times10^{11}$ atoms/cm$^2$. In first main surface 1, the concentration of aluminum may be, for example, less than $5\times10^{10}$ atoms/cm$^2$ or less than $1\times10^{10}$ atoms/cm$^2$. In first main surface 1, the lower limit of the concentration of aluminum is not particularly limited. The lower limit may be, for example, $1\times10^6$ atoms/cm$^2$ or more.

In first main surface 1, the concentration of sodium may be less than $1\times10^{11}$ atoms/cm$^2$. In first main surface 1, the concentration of sodium may be, for example, less than $5\times10^{10}$ atoms/cm$^2$ or less than $1\times10^{10}$ atoms/cm$^2$. In first main surface 1, the lower limit of the concentration of sodium is not particularly limited. The lower limit may be, for example, $1\times10^6$ atoms/cm$^2$ or more.

In first main surface 1, the concentration of potassium may be less than $1\times10^{11}$ atoms/cm$^2$. In first main surface 1, the concentration of potassium may be, for example, less than $5\times10^{10}$ atoms/cm$^2$ or less than $1\times10^{10}$ atoms/cm$^2$. In first main surface 1, the lower limit of the concentration of potassium is not particularly limited. The lower limit may be, for example, $1\times10^6$ atoms/cm$^2$ or more.

In first main surface 1, the concentration of manganese may be less than $1\times10^{11}$ atoms/cm$^2$. In first main surface 1, the concentration of manganese may be, for example, less than $5\times10^{10}$ atoms/cm$^2$ or less than $1\times10^{10}$ atoms/cm$^2$. In first main surface 1, the lower limit of the concentration of manganese is not particularly limited. The lower limit may be, for example, $1\times10^6$ atoms/cm$^2$ or more.

In first main surface 1, the concentration of each of magnesium, calcium, aluminum, sodium, potassium, and manganese may be less than $5\times10^{10}$ atoms/cm$^2$. In first main surface 1, the concentration of each of magnesium, calcium, aluminum, sodium, potassium, and manganese may be less than $1\times10^{10}$ atoms/cm$^2$.

Method for Measuring Concentration of Metal Impurity

Next, a method of measuring the concentration of metal impurity 8 in first main surface 1 will be described.

First, an acid is dropped on the entire surface of first main surface 1 of silicon carbide substrate 10 using a horizontal substrate inspection apparatus. Acid also enters the interior of pit 11. As a result, metal impurity 8 in first main surface 1 is taken into the acid. Next, the entire amount of acid including metal impurity 8 is recovered from the entire surface of first main surface 1. The sample preparation is carried out in a class 10 clean draft installed in a class 100 clean room.

The concentration of metal impurity 8 can be measured by ICP-MS (Inductively Coupled Plasma Mass Spectrometry). As a measuring device, for example, an ICP-MS8800 made of Agilent Corporation can be used. The mass (ng) of metal impurity 8 element obtained by the measurement is divided by the atomic weight of each element to convert into the number of moles, and then multiplied by Avogadro's number to convert into the number of atoms. Next, the number of atoms per unit area is converted by dividing the number of atoms by the area of first main surface 1. The concentration of metal impurity 8 is the number of atoms per unit area.

Figure 4:
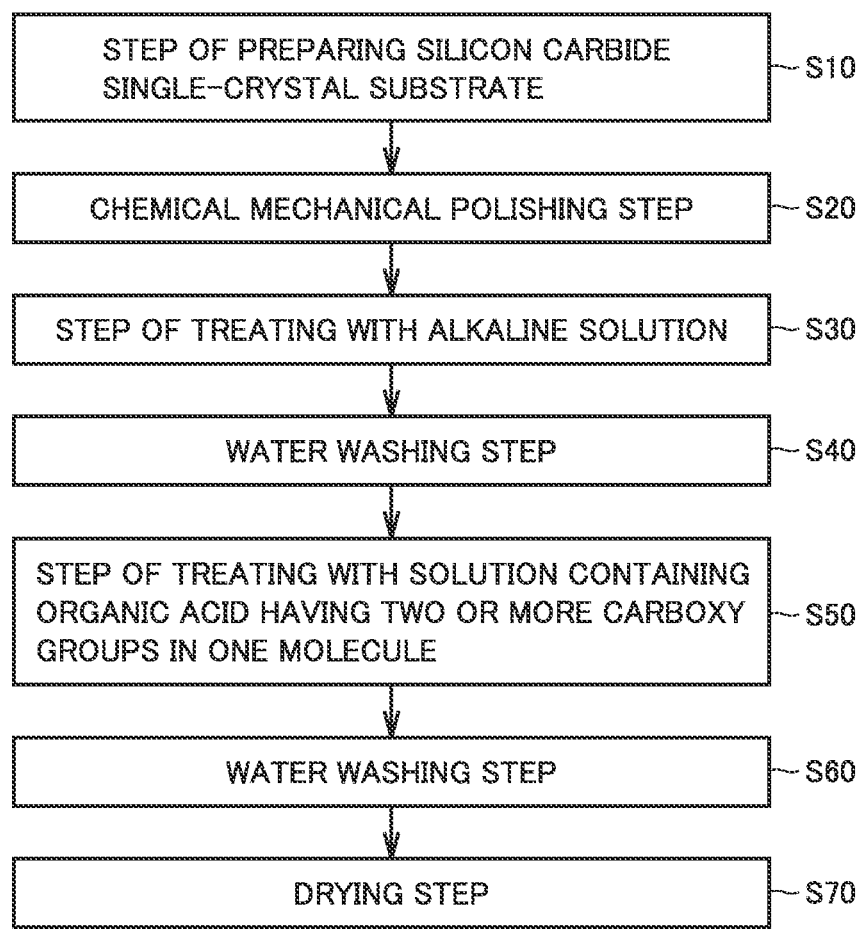
FIG. 4 is a flowchart schematically showing a method of manufacturing a silicon carbide substrate according to an embodiment of the present invention.

Next, a method of manufacturing a silicon carbide substrate according to the present embodiment will be described. FIG. 4 is a flowchart schematically showing a method of manufacturing a silicon carbide substrate according to an embodiment of the present invention.

As shown in FIG. 4, the method of manufacturing silicon carbide substrate 10 according to the present embodiment mainly includes a step S10 of preparing a silicon carbide single-crystal substrate, a chemical mechanical polishing step S20, a step S30 of treating with an alkaline solution, a water washing step S40, a step S50 of treating with a solution containing an organic acid having two or more carboxy groups, a water washing step S60, and a drying step S70.

First, a step of preparing a silicon carbide single-crystal substrate (S10) is performed. Specifically, for example, an ingot composed of a silicon carbide single crystal having a polytype of 4H is formed by a sublimation method. After the ingot is shaped, the ingot is sliced by a wire saw device. As a result, silicon carbide single-crystal substrate 100 is cut out from the ingot.

Silicon carbide single-crystal substrate 100 is composed of hexagonal silicon carbide having a polytype of 4H. Silicon carbide single-crystal substrate 100 has first main surface 1 and second main surface 2 opposite to first main surface 1. First main surface 1 is a plane that is off by 4° or less in the <11-20> direction with respect to the {0001} plane, for example. Specifically, first main surface 1 is a plane that is off by an angle of about 4° or less with respect to the (0001) plane, for example. Second main surface 2 is a plane that is off by an angle of about 4° or less with respect to the (000-1) plane, for example.

Figure 5:
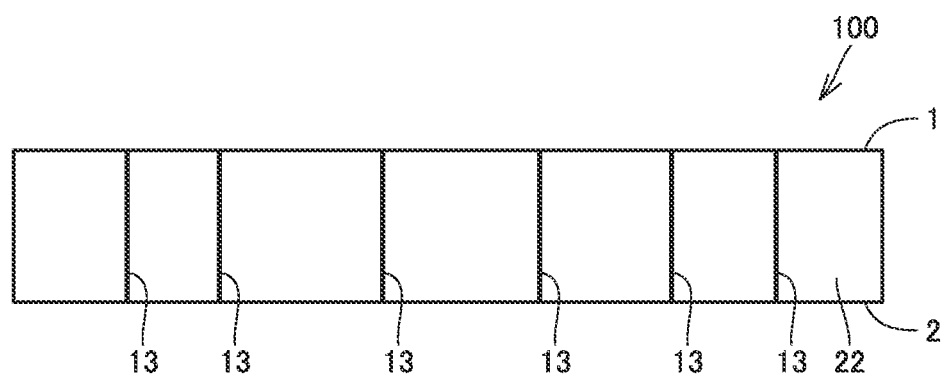
FIG. 5 is a schematic cross-sectional view showing the first step of the method of manufacturing a silicon carbide substrate according to the present embodiment.

As shown in FIG. 5, silicon carbide substrate 10 includes first main surface 1, second main surface 2, a plurality of screw dislocations 13, and silicon carbide region 22. The plurality of screw dislocations 13 is continuous with each of first main surface 1 and second main surface 2. From another viewpoint, the plurality of screw dislocations 13 passes through silicon carbide region 22 from first main surface 1 to second main surface 2. As described above, silicon carbide single-crystal substrate 100 having first main surface 1 and second main surface 2 opposite to first main surface 1 is prepared.

Next, a step of mechanically polishing silicon carbide single-crystal substrate 100 is performed. Specifically, first main surface 1 is disposed to face a surface plate (not shown). Next, a slurry is introduced between first main surface 1 and the surface plate. The slurry comprises, for example, diamond abrasive grains. The diameter of the diamond abrasive grain is, for example, 1 μm or more and 3 μm or less. A load is applied to first main surface 1 by the surface plate. As described above, silicon carbide single-crystal substrate 100 is mechanically polished on first main surface 1.

Next, a chemical mechanical polishing step (S20) is performed. Specifically, chemical mechanical polishing is performed on silicon carbide single-crystal substrate 100 using polishing agent 40. Polishing agent 40 includes abrasive grains 41 and a polishing liquid 42. An abrasive grain 41 is, for example, colloidal silica. Abrasive grain 41 has an average particle diameter of, for example, 20 nm. Polishing agent 40 includes, for example, a lubricant, an oxidizing agent, and a dispersant. The lubricant is, for example, a sugar such as sucrose or glucose. The lubricant may be, for example, a polyhydric alcohol. The oxidizing agent is, for example, an aluminum nitrate aqueous solution. The dispersant contains, for example, magnesium (Mg).

Figure 6:
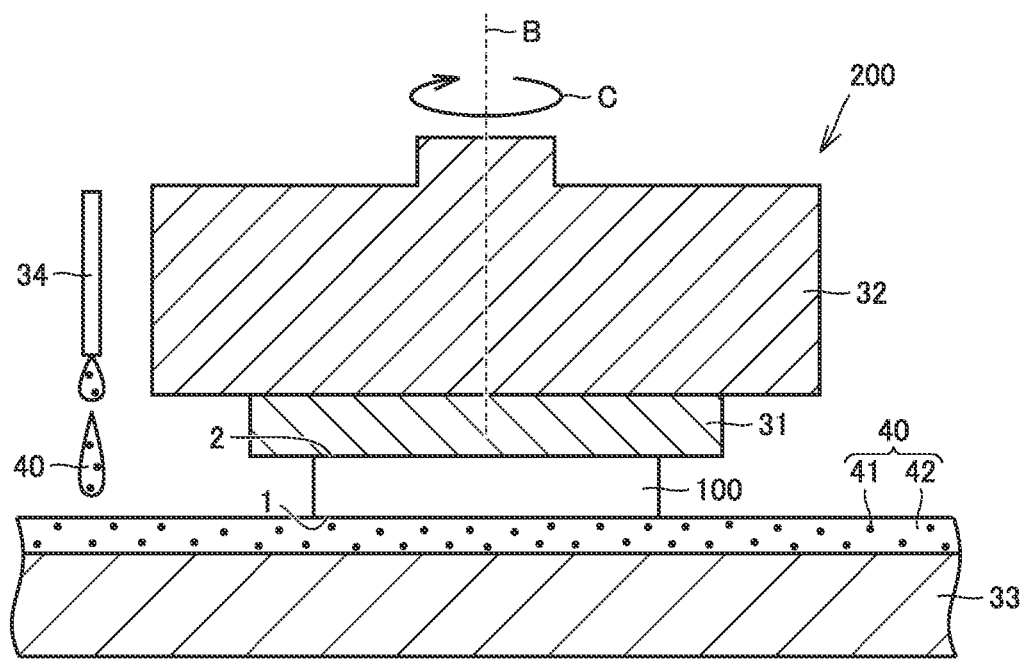
FIG. 6 is a schematic cross-sectional view showing the second step of the method of manufacturing a silicon carbide substrate according to the present embodiment.

As shown in FIG. 6, a chemical mechanical polishing machine 200 mainly includes a polishing cloth 33, a polishing plate 31, a rotation supporting member 32, and a polishing agent supplier 34. Silicon carbide single-crystal substrate 100 is attached to polishing plate 31. Second main surface 2 of silicon carbide single-crystal substrate 100 faces polishing plate 31. First main surface 1 of silicon carbide single-crystal substrate 100 faces polishing cloth 33. Polishing cloth 33 is, for example, a suede polishing cloth. Polishing agent supplier 34 supplies polishing agent 40. Polishing agent 40 supplied from polishing agent supplier 34 is supplied between first main surface 1 of silicon carbide single-crystal substrate 100 and polishing cloth 33.

As shown in FIG. 6, polishing plate 31 is attached to rotation supporting member 32. As rotation supporting member 32 rotates in a rotation direction C around a rotation axis B, silicon carbide single-crystal substrate 100 rotates. A rotational speed of rotation supporting member 32 is, for example, 60 rpm. A rotational speed of the surface plate provided with the polishing cloth is, for example, 60 rpm. The machining surface pressure is, for example, 300 g/cm$^2$. The polishing time is, for example, 5 hours.

According to the method of measuring silicon carbide substrate 10 of the present embodiment, the sugar content of polishing agent 40 is increased by including sugars and the like in polishing agent 40. Specifically, the Brix value of polishing agent 40 is 10 or more. The Brix value of polishing agent 40 may be, for example, 12 or more, or 15 or more. The upper limit of the Brix value may be, for example, 30 or less, or 20 or less. Accordingly, the viscosity of polishing agent 40 increases. As a result, polishing agent 40 is easily supplied between first main surface 1 of silicon carbide single-crystal substrate 100 and polishing cloth 33.

Next, a method of measuring the Brix value will be described. The Brix value can be measured using a hand-held refractometer made of AS ONE Corporation. The model number of the hand-held refractometer is RAB-10. Polishing liquid is dropped on the prism of the hand-held refractometer, and the Brix value is measured. The Brix value can be adjusted by the concentration of colloidal silica, the type of sugar, the amount of sugar, and the like. By adding sugars to the polishing liquid, the viscosity and lubricity of the polishing liquid can be adjusted and the surface tension of the polishing liquid can be changed.

Figure 7:
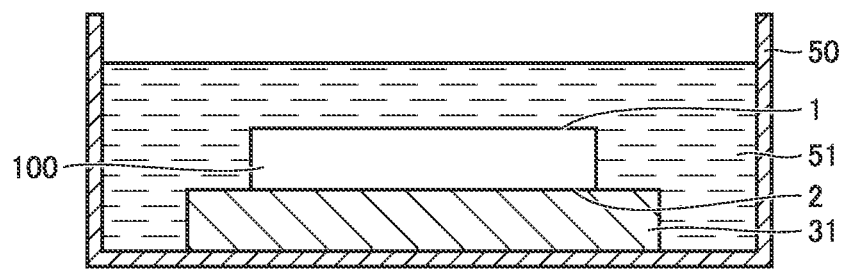
FIG. 7 is a schematic cross-sectional view showing the third step of the method of manufacturing a silicon carbide substrate according to the present embodiment.

Next, the step of treating with alkaline solution (S30) is performed. In the step of treating with the alkaline solution (S30), silicon carbide single-crystal substrate 100 is immersed in alkaline solution 51. As shown in FIG. 7, alkaline solution 51 is contained in a container 50. In a state in which silicon carbide single-crystal substrate 100 is held by polishing plate 31, silicon carbide single-crystal substrate 100 is immersed in alkaline solution 51. Alkaline solution 51 is, for example, tetramethylammonium hydroxide. Alkaline solution 51 has a pH of 10 or more. By immersing silicon carbide single-crystal substrate 100 in alkaline solution 51, abrasive grain 41 attached to silicon carbide single-crystal substrate 100 is removed.

Next, a water washing step (S40) is performed. In the water washing step (S40), silicon carbide single-crystal substrate 100 is washed using water. Silicon carbide single-crystal substrate 100 is washed with water while being held by polishing plate 31. As a result, alkaline solution 51 adhering to silicon carbide single-crystal substrate 100 is washed away by the water.

Figure 8:
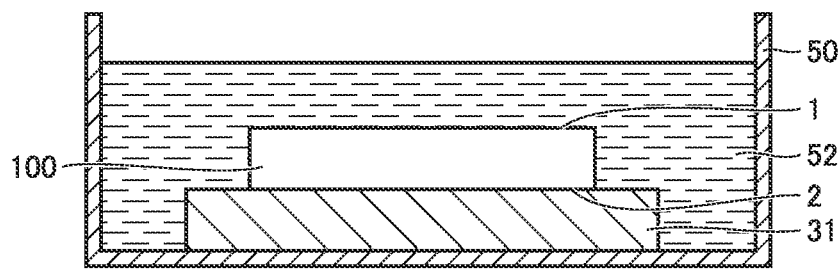
FIG. 8 is a schematic cross-sectional view showing the fourth step of the method of manufacturing a silicon carbide substrate according to the present embodiment.

Next, a step (S50) of treating with a solution containing an organic acid having two or more carboxy groups is performed. In the step (S50) of treating silicon carbide single-crystal substrate 100 with a solution containing an organic acid having two or more carboxy groups, silicon carbide single-crystal substrate 100 is immersed in the acid. As shown in FIG. 8, solution 52 containing an organic acid having two or more carboxy groups in one molecule is contained in container 50. In a state in which silicon carbide single-crystal substrate 100 is held by polishing plate 31, silicon carbide single-crystal substrate 100 is immersed in solution 52 including an organic acid having two or more carboxy groups in one molecule.

The organic acid having two or more carboxy groups in one molecule is, for example, oxalic acid or citric acid. The organic acid having two or more carboxy groups in one molecule may be, for example, malic acid. An organic acid having two or more carboxy groups in one molecule has a chelating action. Specifically, metal impurity 8 is incorporated between two carboxy groups. In particular, divalent cations such as magnesium or calcium are likely to be incorporated between two carboxy groups. Silicon carbide single-crystal substrate 100 is immersed in solution 52 including an organic acid having two or more carboxy groups in one molecule, metal impurity 8 attached to silicon carbide single-crystal substrate 100 is removed. Metal impurity 8 is, for example, magnesium, calcium, aluminum, sodium, potassium, or manganese.

As described above, after the step of performing chemical mechanical polishing on silicon carbide single-crystal substrate 100 using polishing agent 40, silicon carbide single-crystal substrate 100 is processed using solution 52 including the organic acid having two or more carboxy groups in one molecule. The step of immersing silicon carbide single-crystal substrate 100 in alkaline solution 51 is performed after the step of performing chemical mechanical polishing on silicon carbide single-crystal substrate 100 using polishing agent 40 and before the step of treating silicon carbide single-crystal substrate 100 using solution 52 including an organic acid having two or more carboxy groups in one molecule.

Next, a water washing step (S60) is performed. In the water washing step (S60), silicon carbide single-crystal substrate 100 is washed using water. Silicon carbide single-crystal substrate 100 is washed with water while being held by polishing plate 31. Thus, oxalic acid or citric acid adhering to silicon carbide single-crystal substrate 100 is washed away by water.

Next, a drying step (S70) is performed. Silicon carbide single-crystal substrate 100 is dried by, for example, a spin dryer. A rotational speed of the spin drier is, for example, 800 rpm. The drying time is, for example, 120 seconds. Accordingly, silicon carbide single-crystal substrate 100 is dried. Next, silicon carbide single-crystal substrate 100 is removed from polishing plate 31. As described above, silicon carbide substrate 10 (see FIG. 1) according to the present embodiment is obtained. When silicon carbide single-crystal substrate 100 is dried in a state in which metal impurity 8 remains on the surface of silicon carbide single-crystal substrate 100, metal impurity 8 firmly adheres to the surface of silicon carbide single-crystal substrate 100. Therefore, the step of treating with a solution containing an organic acid having two or more carboxy groups (S50) is preferably carried out before the drying step (70).

Next, functions and effects of the silicon carbide substrate and the method of manufacturing the silicon carbide substrate according to the present embodiment will be described.

When chemical mechanical polishing is performed on silicon carbide single-crystal substrate 100 having screw dislocation 13, since a portion of silicon carbide in the vicinity of screw dislocation 13 is mechanically weak, the portion is easily scraped by a collision between silicon carbide single-crystal substrate 100 and abrasive grain 41 or the like. As a result, pit 11 is easily formed on the surface of silicon carbide single-crystal substrate 100.

In order to reduce the collision between silicon carbide single-crystal substrate 100 and abrasive grain 41 or the like, it is necessary to introduce polishing agent 40 having an appropriate thickness between silicon carbide single-crystal substrate 100 and polishing cloth 33 in the chemical mechanical polishing step. However, since silicon carbide has a higher hardness than other semiconductor materials, chemical mechanical polishing is performed at a high rotational speed and under high pressure conditions. Therefore, it is difficult for normal polishing agent 40 to enter between silicon carbide single-crystal substrate 100 and polishing cloth 33. Further, since silicon carbide has lower chemical reactivity than other semiconductor materials, it is difficult to increase the holding power of polishing agent 40 by increasing the hydrophilicity of the surface of silicon carbide single-crystal substrate 100 by chemical reaction.

As a result of intensive studies on measures for suppressing pit 11 formed on the surface of silicon carbide single-crystal substrate 100, the present inventors have obtained the following findings. Specifically, the lubricating action of polishing agent 40 is enhanced so that polishing agent 40 is easily taken in between silicon carbide single-crystal substrate 100 and polishing cloth 33. Specifically, the Brix value of polishing agent 40 was set to 10 or more. Accordingly, since the viscosity of polishing agent 40 can be increased, polishing agent 40 is easily taken in between silicon carbide single-crystal substrate 100 and polishing cloth 33. As a result, it is possible to reduce the strength of impact when abrasive grain 41 collides with silicon carbide single-crystal substrate 100 due to mechanical factors such as vibration of abrasive grain 41 or polishing equipment. As a result, it is possible to prevent pit 11 from being formed in first main surface 1 of silicon carbide single-crystal substrate 100.

Polishing agent 40 for chemical mechanical polishing may contain a dispersant having a divalent cation such as magnesium or calcium. When pit 11 is present on the surface of silicon carbide single-crystal substrate 100, metal impurity 8 such as magnesium enters pit 11. When metal impurity 8 enters pit 11, it may be difficult to completely remove metal impurity 8 in a cleaning step. As a result, the cleanliness of silicon carbide single-crystal substrate 100 deteriorates.

As a result of intensive studies on measures for suppressing deterioration of the cleanliness of the surface of silicon carbide single-crystal substrate 100, the present inventors have obtained the following findings. Specifically, it was found that metal impurity 8 adhered to silicon carbide single-crystal substrate 100 can be removed in the step of performing chemical mechanical polishing by treating silicon carbide single-crystal substrate 100 using an acid having a chelating action. Specifically, after a step of performing chemical mechanical polishing on silicon carbide single-crystal substrate 100 using polishing agent 40, silicon carbide single-crystal substrate 100 is processed using solution 52 including an organic acid having two or more carboxy groups in one molecule. Accordingly, the cleanliness of silicon carbide single-crystal substrate 100 may be improved.

Example

Sample Preparation

First, silicon carbide substrates 10 according to samples 1 to 6 were prepared. Silicon carbide substrate 10 according to Samples 1 to 3 was used as a comparative example. Silicon carbide substrate 10 according to Samples 4 to 6 was used as an example. In the methods of manufacturing silicon carbide substrates according to Samples 3 to 6, polishing agent 40 having a Brix value of 10 or more was used in the chemical mechanical polishing step (S20). In the method of measuring silicon carbide substrate 10 according to Samples 2 and 4 to 6, a step (S50) of treating with a solution containing an organic acid having two or more carboxy groups in one molecular was performed. That is, in the method of manufacturing silicon carbide substrate 10 according to each of Samples 4 to 6, a polishing liquid having a Brix value of 10 or more was used in the chemical mechanical polishing step (S20), and a step (S50) of treating silicon carbide substrate 10 with a solution containing an organic acid having two or more carboxy groups in one molecular was performed.

In the method of manufacturing silicon carbide substrate 10 according to samples 1 and 2, the Brix value of polishing agent 40 was set to 5. In the method of manufacturing silicon carbide substrate 10 according to Samples 3, 5, and 6, the Brix value of polishing agent 40 was set to 20. In the method of manufacturing silicon carbide substrate 10 according to sample 4, the Brix value of polishing agent 40 was set to 30. In the method of manufacturing silicon carbide substrate 10 according to samples 2 and 4, 5% citric acid was used. In the method of manufacturing silicon carbide substrate 10 according to sample 5, 3% citric acid was used. In the method of manufacturing silicon carbide substrate 10 according to sample 6, 3% oxalic acid was used. In silicon carbide substrate 10 according to each of the samples 1 to 6, the densities of screw dislocations 13 were 390/cm², 430/cm², 420/cm², 420/cm², 300/cm², and 480/cm², respectively.

Evaluation Method

The density of screw dislocations 13 in first main surface 1 of silicon carbide substrate 10 according to each of Samples 1 to 6 was measured using an X-ray topography method. The density of pits 11 in first main surface 1 of silicon carbide substrate 10 according to Samples 1 to 6 was measured using a defect inspection apparatus. The maximum diameter of pit 11 is from 1 μm to 10 μm. ICP-MS was used to measure the concentration of metal impurity 8 in the entire surface of first main surface 1 of silicon carbide substrate 10 according to each of the Samples 1 to 6.

Evaluation Results

TABLE 1

| | | Sample 1 | Sample 2 | Sample 3 | Sample 4 | Sample 5 | Sample 6 |
|---|---|---|---|---|---|---|---|
| CMP Conditions | Brix Value of Polishing Liquid [%] | 5 | 5 | 20 | 30 | 20 | 20 |
| | Step of Treating with Acid Having Two or More Carboxy Groups | Not Performed | Citric Acid 5% | Not Performed | Citric Acid 5% | Citric Acid 3% | Oxalic Acid 3% |
| Crystal | Density of Screw Dislocations | 390/cm² | 430/cm² | 420/cm² | 420/cm² | 300/cm² | 480/cm² |
| State of Occurrence of Pits after CMP | Density of Pits Each Having Diameter of 1 to 10 μm | 12/cm² (2161/6 Inches) | 14/cm² (2367/6 Inches) | 1.2/cm² (212/6 Inches) | 0.7/cm² (127/6 Inches) | 1.5/cm² (262/6 Inches) | 1.0/cm² (174/6 Inches) |
| | Occurrence Ratio of Pits Each Having Diameter of 1 to 10 μm to Screw Dislocations | 3.0% | 3.3% | 0.3% | 0.2% | 0.5% | 0.2% |
| Densities of Metal Impurities [×10⁹atoms/cm²] | Mg | 93 | 65 | 85 | <2 | 3 | 5 |
| | Ca | 269 | 54 | 121 | <4 | <4 | 48 |
| | Al | 134 | 60 | 66 | 2 | 2 | 15 |
| | Na | 671 | 103 | 138 | 4 | <2 | 12 |
| | K | 130 | 46 | 73 | <4 | <4 | <4 |
| | Mn | 8 | 5 | 12 | 2 | <2 | <2 |

As shown in Table 1, the densities of pits 11 in first main surface 1 of silicon carbide substrate 10 according to samples 1 to 6 were 12/cm², 14/cm², 1.2/cm², 0.7/cm², 1.5/cm², and 1.0/cm², respectively. The values obtained by dividing the density of pit 11 in first main surface 1 of silicon carbide substrate 10 according to samples 1 to 6 by the density of screw dislocation 13 were 3.0%, 3.3%, 0.3%, 0.2%, 0.5%, and 0.2%, respectively.

The concentration of Mg in first main surface 1 of silicon carbide substrate 10 according to each of samples 1 to 6 was 93×10⁹ atoms/cm², 65×10⁹ atoms/cm², 85×10⁹ atoms/cm², less than 2×10⁹ atoms/cm², 3×10⁹ atoms/cm², and 5×10⁹ atoms/cm². The concentration of Ca in first main surface 1 of silicon carbide substrate 10 according to each of samples 1 to 6 was 269×10⁹ atoms/cm², 54×10⁹ atoms/cm², 121×10⁹ atoms/cm², less than 4×10⁹ atoms/cm², less than 4×10⁹ atoms/cm², and 48×10⁹ atoms/cm².

The concentration of Al in first main surface 1 of silicon carbide substrate 10 according to each of samples 1 to 6 was 134×10⁹ atoms/cm², 60×10⁹ atoms/cm², 66×10⁹ atoms/cm², less than 2×10⁹ atoms/cm², 2×10⁹ atoms/cm², and 15×10⁹ atoms/cm². The concentration of Na in first main surface 1 of silicon carbide substrate 10 according to each of samples 1 to 6 was 671×10⁹ atoms/cm², 103×10⁹ atoms/cm², 138×10⁹ atoms/cm², 4×10⁹ atoms/cm², less than 2×10⁹ atoms/cm², and 12×10⁹ atoms/cm².

The concentration of K in first main surface 1 of silicon carbide substrate 10 according to each of samples 1 to 6 was 130×10⁹ atoms/cm², 46×10⁹ atoms/cm², 73×10⁹ atoms/cm², less than 4×10⁹ atoms/cm², less than 4×10⁹ atoms/cm², and less than 4×10⁹ atoms/cm². The concentration of Mn in first main surface 1 of silicon carbide substrate 10 according to each of samples 1 to 6 was 8×10⁹ atoms/cm², 5×10⁹ atoms/cm², 12×10⁹ atoms/cm², less than 2×10⁹ atoms/cm², less than 2×10⁹ atoms/cm², and less than 2×10⁹ atoms/cm².

From the above results, it was confirmed that by performing the step (S50) of using a polishing liquid having a Brix value of 10 or more and treating with a solution containing an organic acid having two or more carboxy groups in one molecular in the chemical mechanical polishing step (S20), the generation of the originate pit 11 in screw dislocation 13 can be suppressed and the concentration of Mg can be reduced.

It should be understood that the embodiments and examples disclosed herein are illustrative in all respects and are not restrictive. The scope of the present invention is indicated not by the above description but by the claims, and is intended to include meanings equivalent to the claims and all modifications within the scope.

REFERENCE SIGNS LIST 1 first main surface, 2 second main surface, 3 first flat, 4 arc-shaped portion, 5 outer circumferential surface, 6 first screw dislocation, 7 second screw dislocation, 8 metal impurity, 10 silicon carbide substrate, 11 pit, 13 screw dislocation, 22 silicon carbide region, 31 polishing plate, 32 rotation supporting member, 33 polishing cloth, 34 polishing agent supplier, 40 polishing agent, 41 abrasive grain, 42 polishing liquid, 50 container, 51 alkaline solution, 52 solution, 100 silicon carbide single-crystal substrate, 101 first direction, 102 second direction, 200 chemical mechanical polishing machine, A maximum diameter, B rotation axis, C rotation direction, D first depth, W first diameter.

The invention claimed is:

1. A silicon carbide substrate comprising a first main surface and a second main surface opposite to the first main surface, wherein
the silicon carbide substrate includes screw dislocations and pits having a maximum diameter of 1 μm to 10 μm in a direction parallel to the first main surface,
when the screw dislocations and the pits are observed in the first main surface, a percentage obtained by dividing a number of the pits by a number of the screw dislocations is 1% or less, and
a concentration of magnesium in the first main surface is less than $1 \times 10^{11}$ atoms/cm$^2$.

2. The silicon carbide substrate according to claim 1, wherein each of concentrations of calcium, aluminum, sodium, potassium, and manganese in the first main surface is less than $1 \times 10^{11}$ atoms/cm$^2$.

3. The silicon carbide substrate according to claim 1, wherein each of concentrations of magnesium, calcium, aluminum, sodium, potassium, and manganese in the first main surface is less than $5 \times 10^{10}$ atoms/cm$^2$.

4. The silicon carbide substrate according to claim 1, wherein the screw dislocations in the first main surface have an area density of 100 cm$^{-2}$ to 5000 cm$^{-2}$.

5. The silicon carbide substrate according to claim 1, wherein each of concentrations of calcium, aluminum, sodium, potassium, and manganese in the first main surface is less than $1 \times 10^{11}$ atoms/cm$^2$, and the screw dislocations in the first main surface have an area density of 100 cm$^{-2}$ to 5000 cm$^{-2}$.

6. A method of manufacturing a silicon carbide substrate, the method comprising:
preparing a silicon carbide single-crystal substrate having a first main surface and a second main surface opposite to the first main surface;
performing chemical mechanical polishing on the silicon carbide single-crystal substrate using a polishing liquid; and
after the performing the chemical mechanical polishing on the silicon carbide single-crystal substrate using the polishing liquid, treating the silicon carbide single-crystal substrate using a solution containing an organic acid having two or more carboxy groups in one molecule,
wherein the polishing liquid has a Brix value of 10 or more.

7. The method of manufacturing the silicon carbide substrate according to claim 6, further comprising, after performing the chemical mechanical polishing on the silicon carbide single-crystal substrate using the polishing liquid and before treating the silicon carbide single-crystal substrate using the solution containing the organic acid having the two or more carboxy groups in the one molecule, immersing the silicon carbide single-crystal substrate in an alkaline solution.

8. The method of manufacturing the silicon carbide substrate according to claim 6, wherein the organic acid having the two or more carboxy groups in the one molecule is oxalic acid or citric acid.

9. The method of manufacturing the silicon carbide substrate according to claim 6, wherein the Brix value is 30 or less.

10. The silicon carbide substrate according to claim 1, wherein each of concentrations of magnesium, calcium, aluminum, sodium, potassium, and manganese in the first main surface is less than $5 \times 10^{10}$ atoms/cm$^2$, and the screw dislocations in the first main surface have an area density of 100 cm$^{-2}$ to 5000 cm$^{-2}$.

11. The silicon carbide substrate according to claim 1, wherein the first main surface has a maximum diameter of 150 mm or more.

12. The silicon carbide substrate according to claim 1, wherein each of concentrations of calcium, aluminum, sodium, potassium, and manganese in the first main surface is less than $1 \times 10^{11}$ atoms/cm$^2$, and the first main surface has a maximum diameter of 150 mm or more.

13. The silicon carbide substrate according to claim 1, wherein each of concentrations of magnesium, calcium, aluminum, sodium, potassium, and manganese in the first main surface is less than $5 \times 10^{10}$ atoms/cm$^2$, and the first main surface has a maximum diameter of 150 mm or more.

14. The method of manufacturing the silicon carbide substrate according to claim 6, further comprising, after the performing the chemical mechanical polishing on the silicon carbide single-crystal substrate using the polishing liquid and before treating the silicon carbide single-crystal substrate using the solution containing the organic acid having the two or more carboxy groups in the one molecule, immersing the silicon carbide single-crystal substrate in an alkaline solution, wherein the organic acid having the two or more carboxy groups in the one molecule is oxalic acid or citric acid.

15. The method of manufacturing the silicon carbide substrate according to claim 6, further comprising, after the performing the chemical mechanical polishing on the silicon carbide single-crystal substrate using the polishing liquid and before the treating the silicon carbide single-crystal substrate using the solution containing the organic acid having the two or more carboxy groups in the one molecule, immersing the silicon carbide single-crystal substrate in an alkaline solution, wherein the Brix value is 30 or less.

16. The method of manufacturing the silicon carbide substrate according to claim 6, wherein the organic acid having the two or more carboxy groups in the one molecule is oxalic acid or citric acid, and the Brix value is 30 or less.

17. The method of manufacturing the silicon carbide substrate according to claim 6, further comprising, after the performing the chemical mechanical polishing on the silicon carbide single-crystal substrate using the polishing liquid and before the treating the silicon carbide single-crystal substrate using the solution containing the organic acid having the two or more carboxy groups in the one molecule, immersing the silicon carbide single-crystal substrate in an alkaline solution, wherein the organic acid having the two or more carboxy groups in the one molecule is oxalic acid or citric acid, and the Brix value is 30 or less.

* * * * *